(12) United States Patent
Jung

(10) Patent No.: US 6,755,909 B2
(45) Date of Patent: Jun. 29, 2004

(54) METHOD OF CRYSTALLIZING AMORPHOUS SILICON USING A MASK

(75) Inventor: Yun-Ho Jung, Seoul (KR)

(73) Assignee: LG.Philips LCD Co., Ltd., Seoul (KR)

( * ) Notice: Subject to any disclaimer, the term of this patent is extended or adjusted under 35 U.S.C. 154(b) by 15 days.

(21) Appl. No.: 10/151,880

(22) Filed: May 22, 2002

(65) Prior Publication Data

US 2002/0179001 A1 Dec. 5, 2002

(30) Foreign Application Priority Data

May 30, 2001 (KR) .......................................... 2001-29913

(51) Int. Cl.⁷ ............................................. C30B 25/04
(52) U.S. Cl. ..................... 117/4; 117/8; 117/41; 117/43
(58) Field of Search ............................ 117/4, 8, 41, 43; 438/22

Primary Examiner—Felisa Hiteshew
(74) Attorney, Agent, or Firm—McKenna Long & Aldridge LLP

(57) ABSTRACT

A sequential lateral solidification mask having a first region with a plurality of first stripes that are separated by a plurality of first slits. The mask further includes a second region having a plurality of second stripes separated by a plurality of second slits. The second stripes are perpendicular to the first stripes. A third region having a plurality of third stripes separated by a plurality of third slits, with the third stripes being transversely arranged relative to the first stripes. A fourth region having a plurality of fourth stripes and a plurality of fourth slits between the fourth stripes, with the fourth stripes being transversely arranged relative to the second stripes. Sequential lateral solidification is performed using the mask by multiple movements of the mask and multiple, overlapping irradiations.

22 Claims, 6 Drawing Sheets

METHOD OF CRYSTALLIZING AMORPHOUS SILICON USING A MASK

This application claims the benefit of Korean Patent Application No. 2001-29913, filed in Korea on May 30, 2001, which is hereby incorporated by reference for all purposes as if fully set forth herein.

BACKGROUND OF THE INVENTION

1. Field of the Invention

The present invention relates to a method of crystallizing amorphous silicon. More particularly, the present invention relates to a sequential lateral solidification (SLS) crystallizing method suitable for forming polycrystalline silicon having uniform grains.

2. Discussion of the Related Art

Due to a rapid development in information technology, display devices have evolved into instruments that can process and display a great deal of information. While cathode ray tubes (CRT) have served as mainstream display devices, to meet current needs flat panel display devices that are small, light weight, and consume low power, such as liquid crystal displays (LCDs), are becoming increasing important.

LCD devices are typically comprised of two substrates and a liquid crystal layer that is interposed between those substrates. LCD devices produce an image by controlling light transmissivity by varying the arrangement of liquid crystal molecules that are arranged in an electric field.

One LCD substrate includes thin film transistors (TFTs) that act as switching devices. Those TFTs are often formed using an amorphous silicon active layer. On reason for this is that amorphous silicon can be formed on a large, low cost substrate such as glass.

LCD devices also include drive integrated circuits (drive ICs) that control the TFTs. Unfortunately, amorphous silicon does not form a suitable active layer for drive ICs, which are usually CMOS (complementary metal-oxidesemiconductor) devices that require crystalline silicon active layers. Because of this, drive ICs are usually connected to a TFT substrate using a TAB (tape automated bonding) system. This adds significant cost to LCD devices.

Because of limitations of amorphous silicon, LCD devices that incorporate polycrystalline TFT active layers are undergoing research and development. Polycrystalline silicon is highly beneficial because it better suited for use in drive IC devices than amorphous silicon. Polycrystalline silicon thus has the advantage that the number of fabrication steps could be reduced because thin film transistors and drive IC could be formed on the same substrate, eliminating the need for TAB bonding. Furthermore, the field effect mobility of polycrystalline silicon is 100 to 200 times greater than that of amorphous silicon. Polycrystalline silicon is also optically and thermally stable.

Polycrystalline silicon can be formed by depositing amorphous silicon on a substrate, such as by plasma enhanced chemical vapor deposition (PECVD) or low-pressure chemical vapor deposition (LPCVD), and then crystallizing that amorphous silicon into polycrystalline silicon. There are a number of different methods of crystallizing amorphous silicon into polycrystalline silicon, including solid crystallization (SPC), metal induced crystallization (MIC), and laser annealing.

In SPC, a buffer layer is formed on a quartz substrate. Then, amorphous silicon is deposited on the buffer layer. The amorphous silicon is then heated at a high temperature, over 600 degrees Celsius, for a relatively long time. The buffer layer prevents impurities from diffusing into the amorphous silicon. The high temperature causes the amorphous silicon to crystallize. However, the SPC method results in irregular grain growth and non-uniform grain size. Therefore, gate insulators grow irregularly on SPC-formed polycrystalline. This decreases the breakdown voltage of the resulting TFTs. Moreover, the electric properties of the TFTs are reduced because of the irregular grain sizes. Additionally, quartz substrates are expensive.

In MIC, a metal deposited on amorphous silicon induces crystallization at a relatively low temperature. This has the advantage that lower cost glass substrates can be used. However, the deposited metals remain in the silicon layer act as detrimental impurities.

In laser annealing, an excimer laser irradiates an amorphous silicon layer on a substrate for several tens to several hundreds of nanoseconds. This causes the amorphous silicon layer to melt. The melted silicon subsequently solidifies into polycrystalline silicon. In the laser annealing method, crystallization can be accomplished at less than 400 degrees Celsius. Unfortunately, crystallization is relatively poor, particularly if the silicon layer is crystallized using a single laser shot. In practice, re-crystallization is usually performed by irradiating the laser beam about 10 times or so to increase the grain size. Therefore, laser annealing suffers from low productivity. Furthermore, laser irradiation can heat the silicon layer to about 1400 degrees Celsius. Because such temperatures would readily oxidize the silicon layer to produce silicon dioxide ($SiO_2$), laser annealing is usually performed under a high vacuum of $10^{-7}$ to $10^{-6}$ torr.

Recently, a new method of crystallization, often referred to as sequential lateral solidification (SLS), has become of interest. The SLS method takes advantage of the fact that silicon grains grow laterally from the boundary between liquid silicon and solid phase silicon. The SLS method can increase the size of the silicon grains that grow by controlling the energy intensity of a laser beam and the irradiation range of the laser beam (reference, Robert S. Sposilli, M. A. Crowder, and James S. Im, Mat. Res. Soc. Symp. Proc. Vol. 452, 956~957, 1997). This enables TFTs having channel areas of single crystalline silicon.

A conventional SLS method will be described in detail with reference to the attached drawings. FIG. 1 illustrates a conventional SLS apparatus. In FIG. 1, the conventional SLS apparatus includes a light source 1, an attenuator 2, a focusing lens 5, a mask 6, an imaging lens 7, and a translation stage 10, on which a sample 9 having an amorphous silicon layer (element 20 of FIG. 2A) is situated. The SLS apparatus also includes reflective mirrors 3, 4, and 8 to change the direction of the light. The reflective mirrors 3 and 4 are disposed between the attenuator 2 and the focusing lens 5, and the reflective mirror 8 is disposed between the imaging lens 7 and the translation stage 10.

The light source 1 is beneficially a XeCl excimer laser having a wavelength of 308 nm, or a KrF laser having a wavelength of 248 nm. The attenuator 2 controls the energy of the laser beam through the system. The focusing lens 5 and the imaging lens 7 condense the laser beam, while the focusing lens 5 makes the intensity of the laser beam more uniform The mask 6 forms the laser beam into a predetermined shape.

Therefore, the laser beam from the light source 1 is transmitted through the attenuator 2 and is reflected by the reflective mirrors 3 and 4. The laser beam is then condensed by the focusing lens 5, shaped by the mask 6, and passed through the imaging lens 7. Next, the laser beam is reflected by the reflective mirror 8 onto the sample 9. The translation stage 10 then moves the sample 9 and irradiation is repeated.

FIGS. 2A to 2C illustrate a process of crystallizing an amorphous silicon film using the SLS apparatus of FIG. 1. FIG. 2A illustrates an initial step of crystallizing the silicon film wherein a first laser beam irradiation is carried out at a region "A" of the amorphous silicon film 20. As stated above, because the grains of silicon grow laterally from the boundary between liquid phase silicon and solid phase silicon, grains 22a and 22b of the region "A" grow from both sides of the "A" region. Growth of the grains 22a and 22b stops at the line "IIa" where the grains 22a and 22b meet.

FIG. 2B illustrate crystallizing the silicon film when a second laser beam irradiation is carried out at a region "B" of the amorphous silicon film 20. The region "B" includes part of the region "A." The grains 23a and 23b grow from the boundaries of the region "B". In an "AB" region, where the region "A" and the region "B" overlap, the grains 22a of FIG. 2A act as crystallization seeds. The growth of the grains 23a and 23b stop at the "IIb" line where the grains 23a and 23b meet. The grains 23a are larger than the grains 22a and 22b, which were formed after the first laser beam irradiation.

In FIG. 2C, a third laser beam irradiation is accomplished at a region "C" of the amorphous silicon film 20. Grains 24a and 24b of FIG. 2C grow from boundaries of the region "C". The region "C" includes part of the region "B." In the region "BC," where the region "B" and the "C" region overlap, the grains 23a of FIG. 2B act as crystallization seeds. Therefore, the grains 24a of FIG. 2C are much larger than the grains 23a of FIG. 2B.

The whole amorphous silicon film 20 is scanned by repeated laser beam irradiation. Therefore, polycrystalline silicon with large grains is created. Furthermore, crystallization productivity is high because the number of times the same point is irradiated is small.

However, SLS-grown polycrystalline silicon film tends to have different-sized grains and irregular growing directions. Thus, TFTs fabricated from SLS-grown polycrystalline silicon also has properties that depend on the grain-growth.

FIG. 3 shows a current vs. voltage graph of a TFT made with polycrystalline silicon. Here, the x-axis indicates the TFT gate voltage (Vg) and the y-axis indicates the TFT drain current (Id). Also, each line shows a case (solid lines) in which the direction of the channel passed current and the grain-growth are parallel, a case (short dotted lines) which the direction of the channel passed current and the grain-growth direction form an angle of 45 degrees, and a case (long dotted lines) which the direction of the channel passed current and the grain-growth have an angle of 90 degrees. Those lines are established at drain voltages (Vd) of 0.1 V and 10 V.

As shown in FIG. 3, the smaller the angle between the channel direction and the grain-growth direction, the fewer a number of the grain boundaries there are. This improves the current-voltage characteristics. Therefore, if the channel direction of a TFT is parallel with the grain-growth direction, the TFT properties are enhanced. But, if the channel direction of a TFT and the grain-growth direction are at an angle of 90 degrees, the properties of TFT are minimized.

Because SLS-grown polycrystalline silicon has irregular grain-growth directions it is difficult to maximize the properties of TFT formed on SLS-grown polycrystalline silicon. Indeed, it is even difficult to produce TFTs with uniform properties.

Therefore, a technique that improves the grain-growth properties would be beneficial.

SUMMARY OF THE INVENTION

Accordingly, the present invention is directed to a method of manufacturing polycrystalline silicon using a mask that substantially obviates one or more of problems due to limitations and disadvantages of the related art.

An advantage of the present invention is that it provides for polycrystalline silicon having large grains.

Another advantage of the present invention is that it provides for a method of manufacturing polycrystalline silicon with more uniform sized-grains.

Additional features and advantages of the invention will be set forth in the description which follows, and in part will be apparent from the description, or may be learned by practice of the invention. The objectives and other advantages of the invention will be realized and attained by the structure particularly pointed out in the written description and in the claims and appended drawings.

To achieve these and other advantages, and in accordance with the purpose of the present invention, as embodied and broadly described, a sequential lateral solidification mask includes a first region having a plurality of first stripes and a plurality of first slits that are located between the first stripes. Additionally, the mask includes a second region having a plurality of second stripes and a plurality of second slits located between the second stripes. The plurality of second stripes is perpendicular to the plurality of first stripes. Additionally, a third region has a plurality of third stripes and a plurality of third slits located between the third stripes. The third stripes and the third slits correspond to the first slits and the first stripes, respectively. A fourth region has a plurality of fourth stripes and a plurality of fourth slits located between the fourth stripes. The fourth stripes and the fourth slits correspond to the second slits and the second stripes, respectively.

In the above mask, the stripes of the first region to the fourth region are made of a light shielding film, and the width of each stripe is smaller than or equal to the width of each slit. Also, the mask can be subsequently arranged in order of the first region to the fourth region, or arranged in order of the first, third, second, and fourth regions.

In another aspect, a method of crystallizing a silicon film uses a mask having a first region having a plurality of first stripes and a plurality of first slits that are located between the first stripes, and a second region having a plurality of second stripes and a plurality of second slits that are located between the second stripes, wherein the plurality of second stripes are perpendicular to the plurality of first stripes. Additionally, the mask used in the method includes a third region having a plurality of third stripes and a plurality of third slits that are located between the third stripes, wherein the third stripes and the third slits correspond to the first slits and the first stripes, respectively. Furthermore, that mask includes a fourth region having a plurality of fourth stripes and a plurality of fourth slits that are located between the fourth stripes, wherein the fourth stripes and the fourth slits correspond to the second slits and the second stripes, respectively. The method includes a step of setting the mask relative to a substrate having an amorphous silicon film, applying a first laser shot to the silicon film through the mask, thereby first portions that correspond to the slits are crystallized, moving the substrate having the crystallized first portions by a quarter width of the mask; and applying a second laser shot to the silicon film. The process continues by moving the substrate by quarter mask widths and irradiating the silicon film.

In the above-mentioned method, the laser beam is irradiated four times at one region of the silicon film. Additionally, the stripes of the first region to the fourth region of the mask are made of a light shielding film, and a width of each stripe of the mask is smaller than or equal to that of each slit. Also, the mask can be arranged subsequently in order of the first region to the fourth region, or arranged in order of the first, third, second, and fourth regions.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiment of the present invention, which is illustrated in the accompanying drawings.

Figure 4:
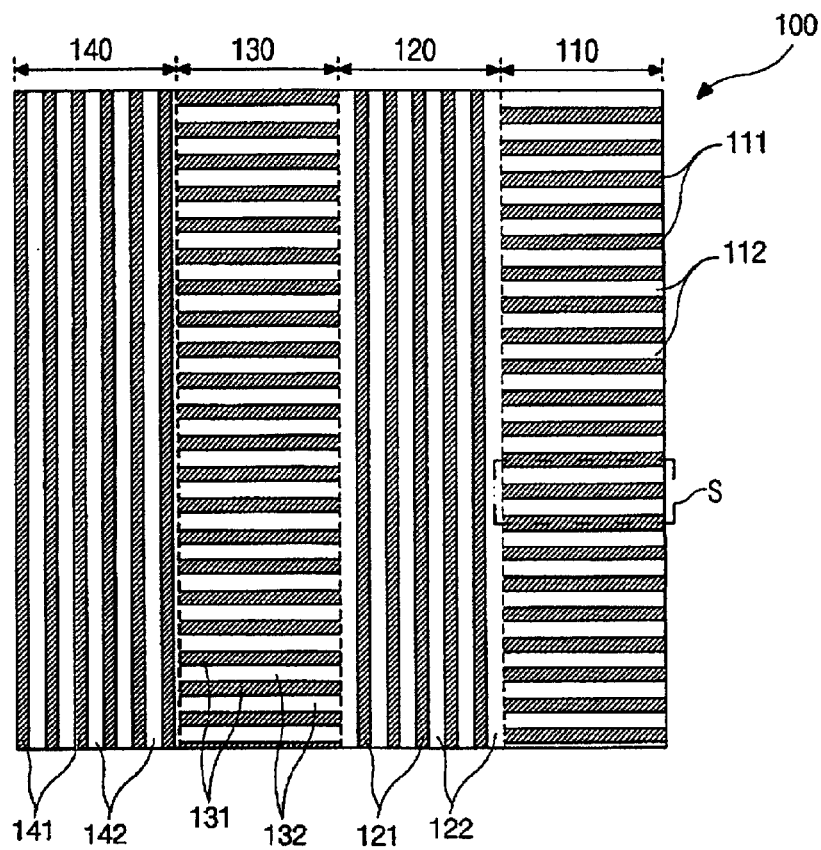
FIG. 4 is a schematic configuration of a mask to manufacture a polycrystalline silicon according to the present invention.

FIG. 4 is a schematic configuration of a sequential lateral solidification (SLS) mask 100 that is used to fabricate polycrystalline silicon according to the present invention. As shown, the mask 100 includes first to fourth regions 110, 120, 130, and 140. The first region 110 has a plurality of first stripes 111 separated by fixed space 112, the second region 120 has a plurality of second stripes 121 separated by fixed spaces 122, the third region 130 has a plurality of third stripes 131 separated by spaces 132, with the third strips 131 being aligned with the spaces 112 (also referred to as slits) of the first stripes 111, and the fourth region 140 has a number of fourth stripes 141 that are separated by spaces 142, with the fourth stripes being aligned with the spaces 122 of the second region 120. Here, the first stripes 111 and the third stripes 131 are transversely arranged, and the second stripes 121 and the fourth stripes 141 are longitudinally arranged. Therefore, the first stripes 111 and the second stripes 121 are perpendicular.

The stripes 111, 121, 131 and 141 of the each region are made of a light shielding film that does not pass a laser beam. The slits 112, 122, 132 and 142 are transparent to a laser beam. It is desirable that the width of the stripes 111, 121, 131 and 141 be smaller than or equal to the width of the slits 112, 122, 132 and 142. This enables the amorphous silicon to be completely exposed to the laser beam using the processes described subsequently. The width of the stripes 111, 121, 131 and 141 can be changed according to the energy density of the laser beam or according to the condition of the silicon film. For example, the width can be 2 mm to 10 mm.

While the mask 100 shows a particular arranging order of the first region to the fourth region (the regions 110, 120, 130 and 140), that order can be changed. For example, the mask 100 could be arranged in order of (from right to left) the first region 110, the third region 130, the second region 120, and the fourth region 140. The widths of the first to fourth regions are beneficially equal.

By using the mask 100 of FIG. 4, a laser beam is first irradiated onto an amorphous silicon film such that the amorphous silicon film is melted and subsequently crystallized. Then, the substrate that holds the amorphous silicon film is moved by a quarter width of the mask 100 and a second laser beam irradiation is carried out on the amorphous silicon film such that the amorphous silicon film is re-crystallized. Next, the substrate is shifted by another quarter width of the mask 100 and a third laser beam irradiation is performed such that the amorphous silicon is again re-crystallization. Subsequently, after the substrate is moved by another quarter width of the mask 100, the laser beam is irradiated a fourth time onto the amorphous silicon film to once again re-crystallize that film.

The size of the laser beam can be reduced by a lens to control the intensity of the laser beam. Accordingly, a mask 100 having a width of 16 mm and a reduction ratio of the laser beam of ¼, the substrate with the amorphous silicon layer should be moved 1 mm.

Figure 1:
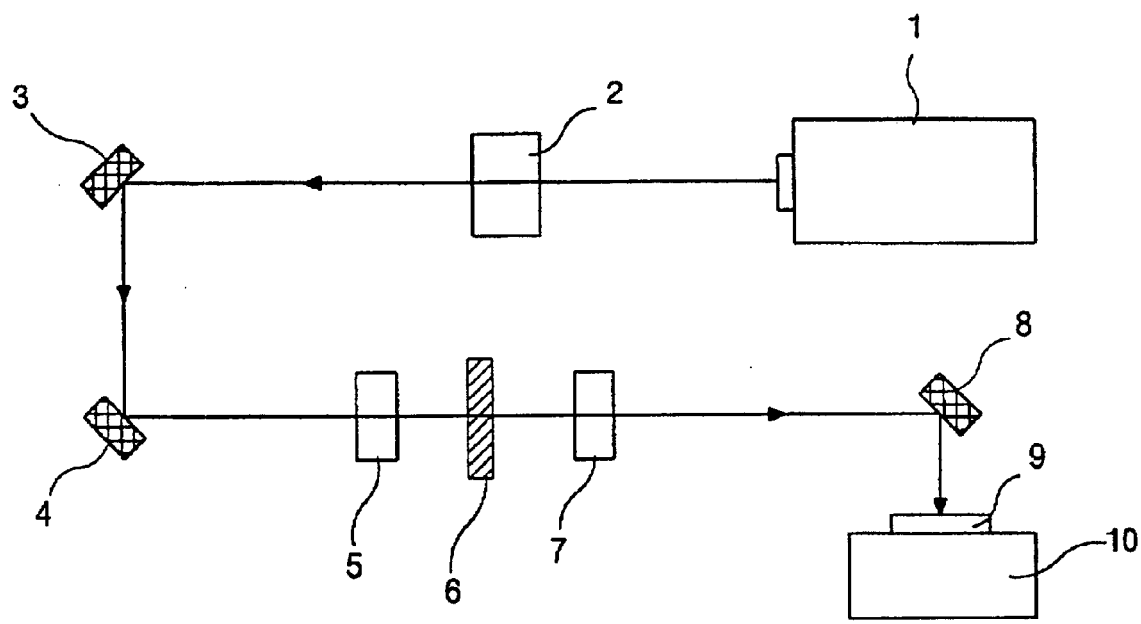
FIG. 1 is a schematic configuration of a conventional sequential lateral solidification (SLS) apparatus.
Figure 2A:
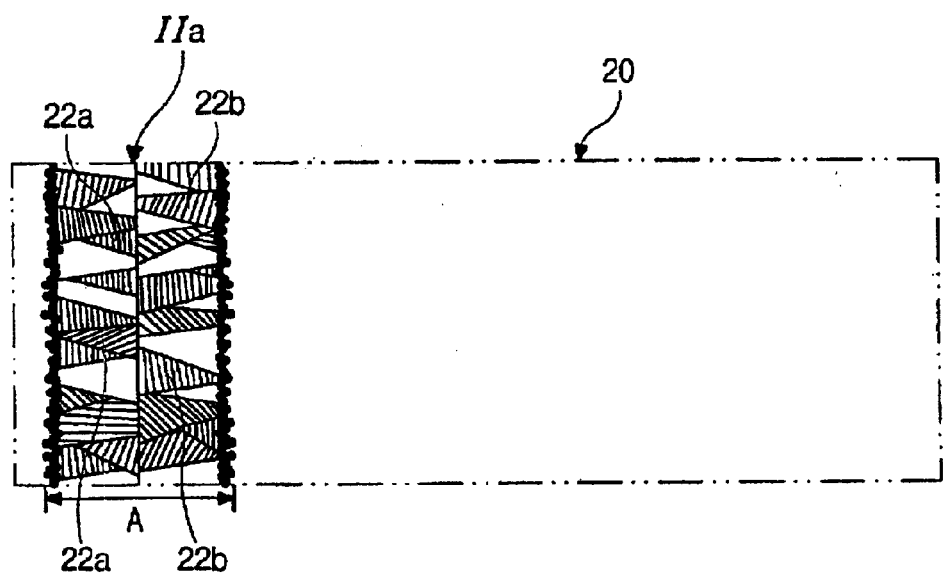
FIGS. 2A to 2C are plan views showing process steps of crystallizing an amorphous silicon film into a polycrystalline silicon by a conventional SLS method.
Figure 2B:
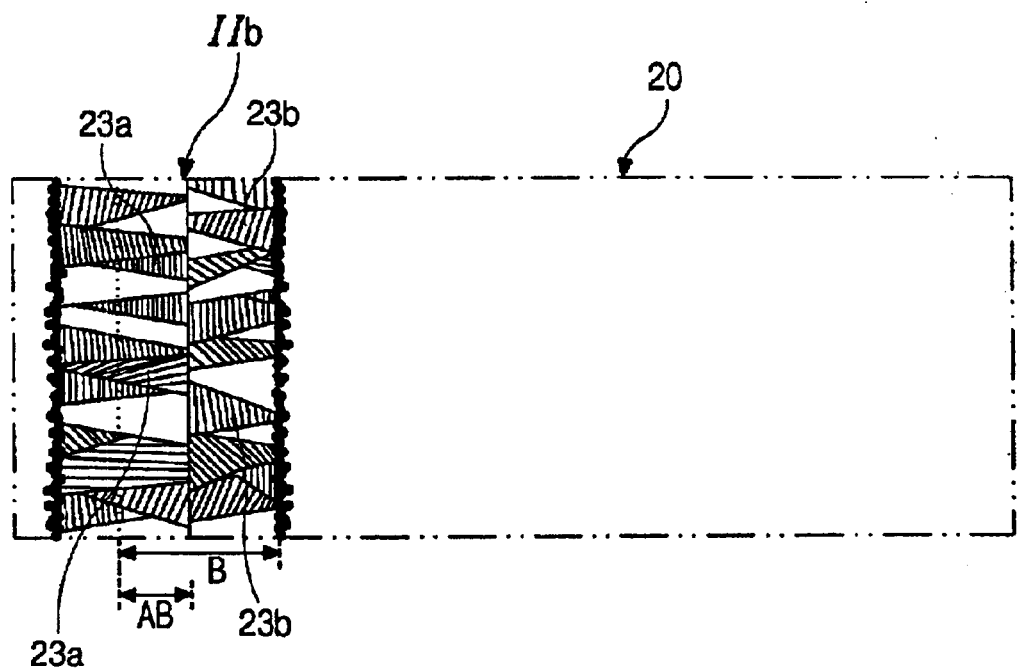
Figure 2C:
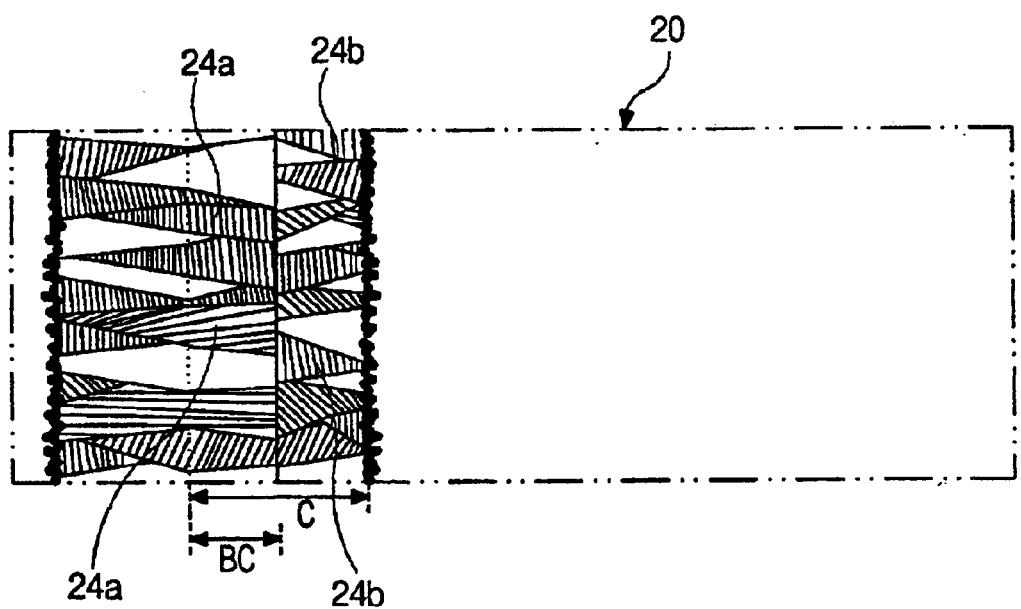
Figure 3:
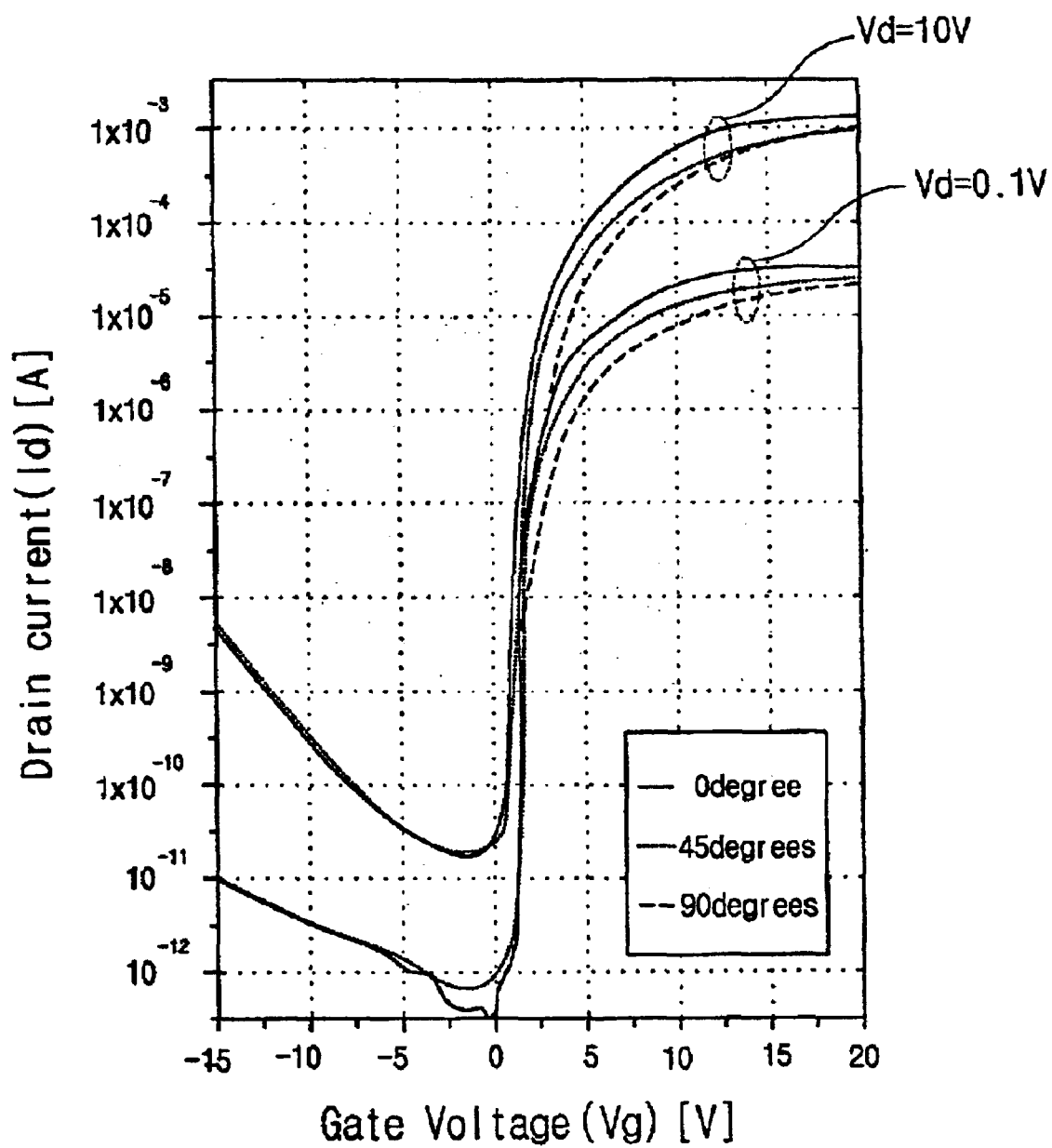
FIG. 3 is a graph showing current-voltage characteristics of TFT formed with polycrystalline silicon film by a conventional SLS method.

FIGS. 5A to 5D illustrate a process according to the present invention of crystallizing amorphous silicon using the mask 100 of FIG. 4. The overall crystallization apparatus can be the same apparatus as that of FIG. 1, except that the mask 100 is used. In FIGS. 5A to 5D, the illustrated region is part of a region that corresponds to the first region of the mask 100 of FIG. 4, i.e. a region "S" of FIG. 4.

Figure 5A:
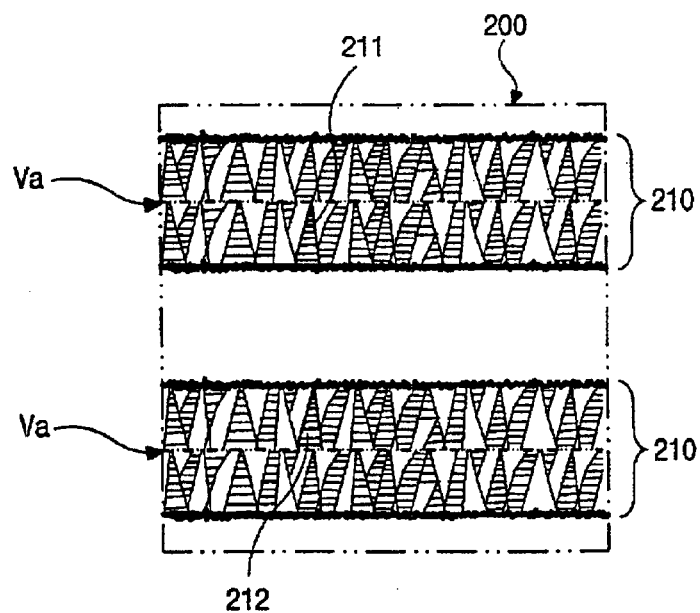
FIGS. 5A to 5D show crystallization process steps of crystallizing an amorphous silicon film into a polycrystalline silicon film according to the present invention.

FIG. 5A illustrates an initial step of crystallizing silicon 200 when a laser beam is first irradiated onto the silicon 200. In FIG. 5A, the laser beam is irradiated on portions 210 of the silicon 200 that correspond to the slits 112 of the first region 110 in the mask 100 of FIG. 4. The portions 210 of the silicon 200 are melted and cooled to form grains 211 and 212. The growth of the grains 211 and 212 starts from the edges of the portions 210 of the silicon 200 that are exposed to the laser beam and progress toward the center of the portions 210 so it stops at the line "Va" where grains having different growing direction meet.

Figure 5B:
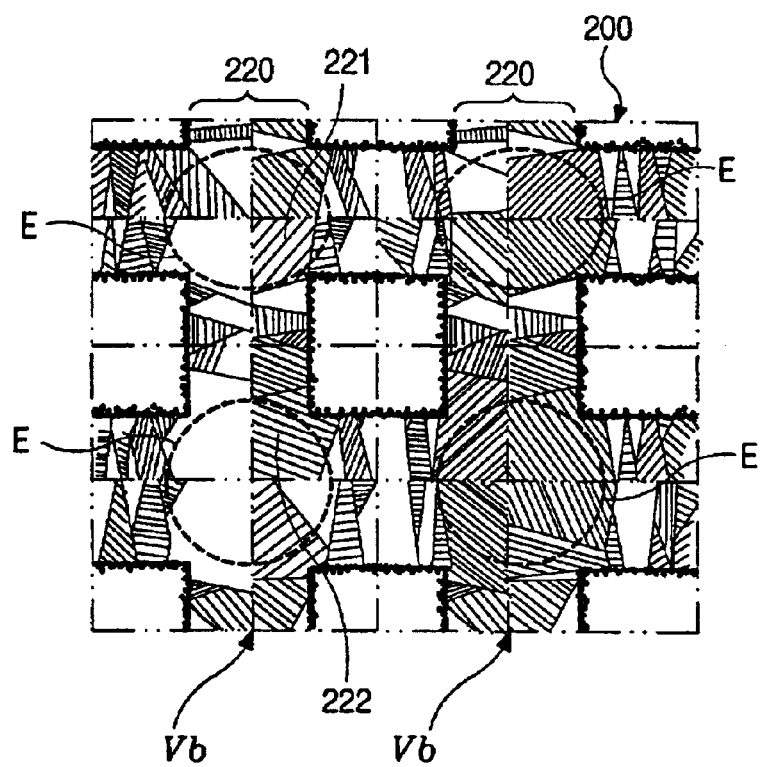

FIG. 5B shows a second step of crystallizing the silicon 200. After the silicon 200 is moved by a quarter width of the mask 100 to the left, the second laser beam irradiation is performed on portions 220 of the silicon 200. The portions 220 correspond to the second region 120 of the mask 100. The portions 220 are melted and cooled, resulting in crystallization of the silicon. In the portions 220 the grains 221 and 222 grow from edges of the portions 220 in a direction that is perpendicular to the grain-growth direction of the grains 211 and 212 of FIG. 5A. The grains 211 and 212 stop growing at the line "Vb" where the grains meet. In regions "E" where the portions 210 and the portions 220 overlap the grains 211 and 212 of FIG. 5A (created in the first laser beam irradiation) act as a crystallization seeds. Thus, the sizes of the grains 221 and 222 are greater than that of the grains 211 and 212 of FIG. 5A.

Figure 5C:
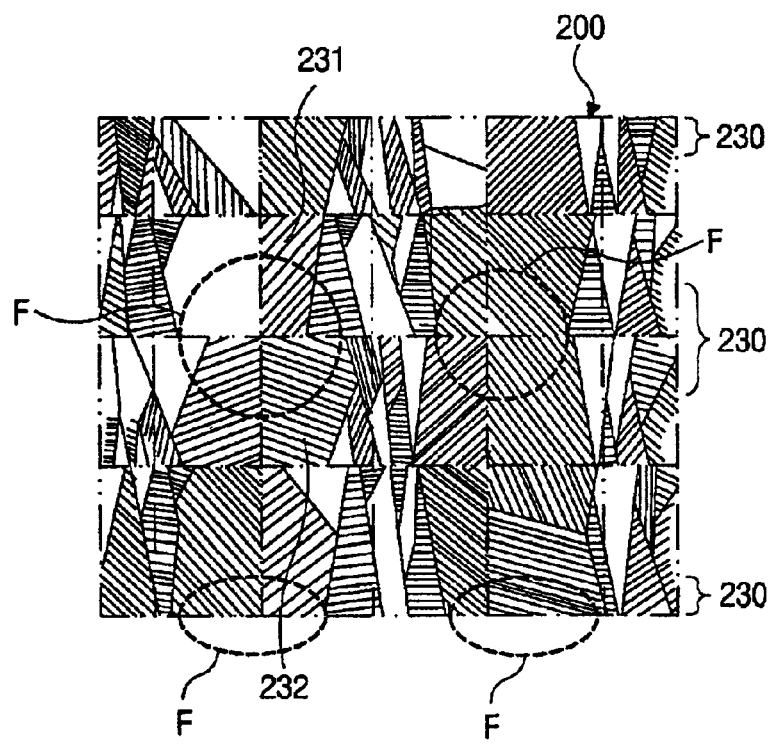

Next, FIG. 5C illustrates a third crystallization step. In FIG. 5C, the silicon 200 is moved a quarter width of the mask 100 to the left. Then, the laser beam is third irradiated onto portions 230 of the silicon 200, which correspond to the slits 132 of the mask 100 (see FIG. 4). The portions 230 melt and then cool such that crystallization is accomplished in the portions 230. In the regions "F" where the portions 220 and the portions 230 overlap, the grains 221 and 222 (produced in the second laser beam irradiation) act as crystallization seeds. Thus, the sizes of the grains 231 and 232 increases.

Figure 5D:
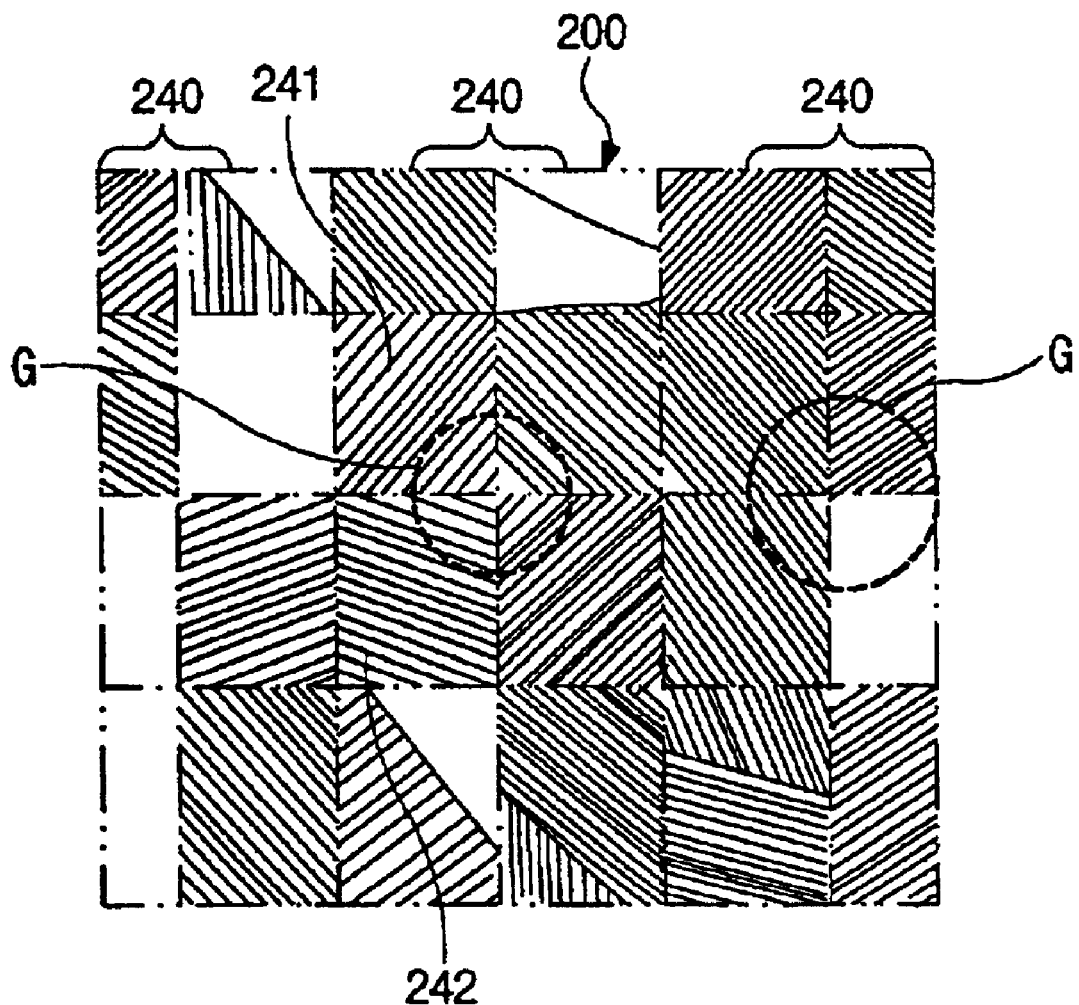

FIG. 5D illustrates a fourth crystallization step. In FIG. 5D, after the silicon 200 is moved by a quarter width of the mask 100 to the left, the laser beam is irradiated onto portions 240 of the silicon 200. Those portions 240 correspond to the slits 142 of the mask 100 of FIG. 4. The portions 240 melt and then cool such that crystallization is accomplished. In the regions "G" where the portions 230 and the portions 240 of the silicon 200 cross, the grains 231 and 232 created in the step illustrated in FIG. 5C act as crystallization seeds. Therefore, as showed in FIG. 5D, grains 241 and 242 having a square shape are produced.

Accordingly, by repeating the foregoing process, polycrystalline silicon having large and relatively uniform grains is created. A TFT fabricated on such polycrystalline silicon has relatively uniform characteristics. A laser crystallization method as described above is composed of four laser irradiations. Therefore, the oxidation rate of the film's surface is low enough that crystallization can be accomplished in a normal atmosphere.

It will be apparent to those skilled in the art that various modifications and variation can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of crystallizing an amorphous silicon film using sequential lateral solidification that is performed using a mask having a first region with a plurality of first stripes and first slits located between the first stripes, a second region with a plurality of second stripes and second slits located between the second stripes, wherein the plurality of second stripes are perpendicular to the plurality of first stripes, a third region with a plurality of third stripes and third slits located between the third stripes, wherein the third stripes and the third slits correspond to the first slits and the first stripes, respectively, and a fourth region with a plurality of fourth stripes and fourth slits located between the fourth stripes, wherein the fourth stripes and the fourth slits correspond to the second slits and the second stripes, respectively, the method comprising:
setting the mask over a substrate having an amorphous silicon film;
applying a laser beam to the amorphous silicon film through the mask such that portions that correspond to the first, second, third, and fourth slits are crystallized;
moving the substrate having the crystallized portions by a quarter width of the mask; and repeatedly applying a laser beam to the amorphous silicon film after moving the substrate by quarter widths of the mask.

2. The method according to claim 1, wherein the laser beam is irradiated four times across one region of the amorphous silicon film.

3. The method according to claim 1, wherein the first, second, third, and fourth stripes are comprised of a light shielding film.

4. The method according to claim 1, wherein widths of the first, second, third, and fourth stripes are less than or equal to the widths of the first, second, third, and fourth slits, respectively.

5. The method according to claim 1, wherein the sequential lateral solidification mask is arranged subsequently such that the second region is disposed between the first and third regions.

6. A sequential lateral solidification mask, comprising:
a first region having a plurality of first stripes separated by first slits;
a second region having a plurality of second stripes separated by second slits, wherein the plurality of second stripes are perpendicular to the plurality of first stripes;
a third region having a plurality of third stripes separated by third slits, wherein the third stripes are parallel to the first stripes; and
a fourth region having a plurality of fourth stripes separated by fourth slits, wherein the fourth stripes are parallel to the second stripes.

7. The sequential lateral solidification mask according to claim 6, wherein the first, second, third, and fourth stripes are comprised of a light shielding film.

8. The sequential lateral solidification mask according to claim 6, wherein widths of the first, second, third, and fourth stripes are less than or equal to widths of the first, second, third, and fourth slits, respectively.

9. The sequential lateral solidification mask according to claim 6, wherein the second region is disposed between the first and third regions.

10. The sequential lateral solidification mask according to claim 6, wherein the third region is disposed between the first and second regions.

11. The sequential lateral solidification mask according to claim 6, wherein the first region is next to the fourth region.

12. The method according to claim 1, wherein the mask is arranged such that the third region is disposed between the first and second regions.

13. A method of crystallizing a silicon film using sequential lateral solidification through a mask having a first region with a plurality of first stripes and first slits, a second region with a plurality of second stripes and second slits, wherein the plurality of second stripes are perpendicular to the plurality of first stripes, a third region with a plurality of third stripes and third slits, wherein the third stripes are parallel with the first stripes, and a fourth region with a plurality of fourth stripes and fourth slits, wherein the fourth stripes are parallel with the second stripes, the method comprising:
setting the mask over a substrate having a silicon film;
applying a laser beam to the silicon film through the mask such that portions that corresponds to the first, second, third, and fourth slits are crystallized;
moving the silicon film relative to the mask by a quarter width of the mask; and repeatedly applying the laser beam to the silicon film after moving the substrate by quarter widths of the mask.

14. The method according to claim 13, wherein the laser beam is irradiated four times across one region of the silicon film.

15. The method according to claim 13, wherein the first, second, third, and fourth stripes are comprised of a light shielding film.

16. The method according to claim 13, wherein widths of the first, second, third, and fourth stripes are less than or equal to the widths of the first, second, third, and fourth slits, respectively.

17. The method according to claim 13, wherein the second region is disposed between the first and third regions.

18. The method according to claim 13, wherein the third region is disposed between the first and second regions.

19. The method according to claim 13, wherein the third stripes are traverse to the first stripes.

20. The method according to claim 13, wherein the fourth stripes are traverse to the second stripes.

21. A polycrystalline film comprised of a pattern of crystalline grains grown in a first direction and crystalline grains grown in a second direction, wherein the first and second directions are orthogonal, and wherein the crystalline grains grown in the first direction and crystalline grains grown in the second direction share grain boundaries.

22. The polycrystalline film of claim 21, wherein the film includes at least silicon.

* * * * *